(12) United States Patent
Morishima

(10) Patent No.: US 7,816,981 B2
(45) Date of Patent: Oct. 19, 2010

(54) SIGNAL GENERATING APPARATUS AND CLASS-D AMPLIFYING APPARATUS

(75) Inventor: Morito Morishima, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 174 days.

(21) Appl. No.: 12/288,580

(22) Filed: Oct. 22, 2008

(65) Prior Publication Data
US 2009/0108932 A1    Apr. 30, 2009

(30) Foreign Application Priority Data
Oct. 24, 2007    (JP)    ............... 2007-276112

(51) Int. Cl.
*H03F 3/38* (2006.01)
(52) U.S. Cl. .................. 330/10; 330/251; 330/207 A
(58) Field of Classification Search .......... 330/10, 330/251, 207 A
See application file for complete search history.

(56) References Cited

U.S. PATENT DOCUMENTS

| | | | | |
|---|---|---|---|---|
| 3,900,823 A | * | 8/1975 | Sokal et al. ............... | 330/149 |
| 5,422,597 A | * | 6/1995 | Stengel et al. ............. | 330/10 |
| 5,784,017 A | * | 7/1998 | Craven .................... | 341/126 |
| 7,184,481 B2 | * | 2/2007 | Kitamura ................. | 375/238 |
| 7,498,876 B2 | * | 3/2009 | Peruzzi et al. ............ | 330/10 |
| 7,626,519 B2 | * | 12/2009 | Risbo ..................... | 341/53 |
| 2007/0132509 A1 | * | 6/2007 | Mochizuki ............... | 330/10 |

FOREIGN PATENT DOCUMENTS

JP    2006-054815    2/2006

* cited by examiner

*Primary Examiner*—Patricia Nguyen
(74) *Attorney, Agent, or Firm*—Pillsbury Winthrop Shaw Pittman LLP

(57) ABSTRACT

A signal generating apparatus includes: a data generator which generates a data series in which first, second, third and fourth data are arranged at a sampling period; a first signal generator which generates a first pulse-width modulation signal in which a pulse is arranged in a pulse period longer than the sampling period, time points of front and rear edges of the pulse being set in response to the first and second data; and a second signal generator which generates a second pulse-width modulation signal in which a pulse is arranged between the adjacent pulses of the first pulse-width modulation signal, time points of front and rear edges of the pulse of the second pulse-width modulation signal been set in response to the third and fourth data, respectively.

5 Claims, 6 Drawing Sheets

SIGNAL GENERATING APPARATUS AND CLASS-D AMPLIFYING APPARATUS

BACKGROUND OF THE INVENTION

The present invention is related to a technique for generating signals (will be referred to as "pulse-width modulation signals" hereinafter), the pulse widths of which have been set in response to a time sequence of a plurality of data.

Signal generating apparatus (PWM modulation circuits) which generate pulse-width modulation signals from a time sequence of digital-formatted data are suitably utilized in, for example, class-D amplifying apparatuses. JP-A-2006-54815 discloses the following technical idea: That is, in a pulse-width modulation signal, time points of both a front edge and a rear edge in each of pulses of the pulse-width modulation signal are controlled in response to 2 pieces of data, so that a time period (will be referred to as "pulse period" hereinafter) in which the pulses are arranged in the pulse-width modulation signal is made two times longer than a time length of a sampling period of data. Further, JP-A-2006-54815 describes such an arrangement that pulse-width modulation signals (w1(t) and w2(t)) of two systems which have an in-phase relation are generated in such a manner that 2 pieces of pulses equivalent to a difference between both the pulse-width modulation signals may have pulse widths in response to 2 pieces of data.

However, in any of the arrangements disclosed in JP-A-2006-54815, the modulating operations of 2 pieces of data are merely carried out every pulse period. As a result, there is such a restriction that the sampling period cannot be set to the time length shorter than a half of the pulse period.

SUMMARY OF THE INVENTION

While considering the above-described problem, the present invention has an object to achieve such a technical idea that a sampling period is set to be a sufficiently short time with respect to a pulse period (namely, sampling frequency is sufficiently increased.

In order to solve the above-described problem, a signal generating apparatus, according to the present invention, includes:

a data generator which generates a data series in which a plurality of data containing first data, second data, third data, and fourth data are arranged at a predetermined sampling period;

a first signal generator which generates a first pulse-width modulation signal in which a pulse is arranged in a pulse period longer than the predetermined sampling period, a time point of a front edge of the pulse being set in response to the first data, and a time point of a rear edge of the pulse being set in response to the second data; and a second signal generator which generates a second pulse-width modulation signal in which a pulse is arranged between the adjacent pulses of the first pulse-width modulation signal, a time point of a front edge of the pulse of the second pulse-width modulation signal been set in response to the third data, and a time point of a rear edge of the pulse of the second pulse-width modulation signal been set in response to the fourth data.

In the above-described arrangement of the signal generating apparatus, the pulses of the first pulse-width modulation signal are defined based upon the first data and the second data, and further, the pulses of the second pulse-width modulation signal are defined based upon the third data and the fourth data. As a result, the sampling period can be set to be a sufficiently short time with respect to the pulse period (namely, sampling frequency of data series can be sufficiently increased). Accordingly, the electric power which is supplied to a load circuit can be controlled in high resolution (namely, narrow stepping width) in response to the first pulse-width modulation signal and the second pulse-width modulation signal. In addition, a dynamic range of the above-described electric power can be easily secured (namely, S/N ratio can be improved). It should be understood that in a preferred embodiment of the present invention, an interval among the respective pulses contained in the first pulse-width modulation signal is equal to an interval among the respective pulses contained in the second pulse-width modulation signal.

It should also be noted that a typical example of the above-described data generating generator corresponds to a noise shaping filter capable of suppressing a quantize noise. Alternatively, an oversampling circuit which over-samples a data series supplied from an upstream apparatus in a predetermined sampling period may also be employed as the above-described data generator. In other words, the above-described data generator may be merely realized by any means capable of outputting a data series in which a plurality of data have been arranged in a predetermined sampling period. Therefore, there is no restriction in a concrete structure of the data generator. Also, such an arrangement capable of generating 3 series, or more series of pulse-width modulation signals may be covered by the technical scope of the present invention. In the above-explained arrangement capable of generating 3 series, or more series of the pulse-width modulation signals, one pulse-width modulation signal selected from 3 series, or more series of the above-described pulse-width modulation signals is grasped as the first pulse-width modulation signal of the present invention, and another pulse-width modulation signal selected therefrom is grasped as the second pulse-width modulation signal of the present invention.

In the signal generating apparatus according to a preferred embodiment of the present invention, the first signal generator generates the first pulse-width modulation signal in such a manner that the larger the numeral value of the first data, or the second data becomes, the wider the pulse width thereof becomes; and the second signal generator generates the second pulse-width modulation signal in such a manner that the larger the numeral value of the third data, or the fourth data become, the narrower the pulse width thereof becomes. In accordance with the above-described embodiment, it is possible to reduce such a possibility that the pulses of the first pulse-width modulation signal are overlapped with the pulses of the second pulse-width modulation signal.

The signal generating apparatus related to the preferred embodiment of the present invention is provided with an adjusting unit (for example, adjusting unit 56 of FIG. 3) for changing a logic level of the first pulse-width modulation signal and a logic level of the second pulse-width modulation signal from each other in such a case that the pulse of the first pulse-width modulation signal is overlapped with the pulse of the second pulse-width modulation signal. In accordance with the above-described embodiment, since the numeral values of the preceding and succeeding data are largely changed, even in such a case that the pulses of the first pulse-width modulation signal are overlapped with the pulses of the second pulse-width modulation signal, the load circuit can be properly driven in response to the data series.

The signal generating apparatus related to the respective embodiments of the present invention may be suitably employed in a class-D amplifying apparatus. A class-D amplifying apparatus, according to one preferred embodiment of the present invention, is equipped with the signal generating apparatus related to any one of the above-described embodiments; a first driver (for example, driving unit 21 of FIG. 1) for controlling a supply of electric power with respect to a load circuit in response to the first pulse-width modulation signal; and a second driver (for example, driving unit 22 of FIG. 1) for controlling the supply of the electric power with respect to the load circuit in response to the second pulse-width modulation signal.

DETAILED DESCRIPTION OF PREFERRED EMBODIMENTS

Figure 1:
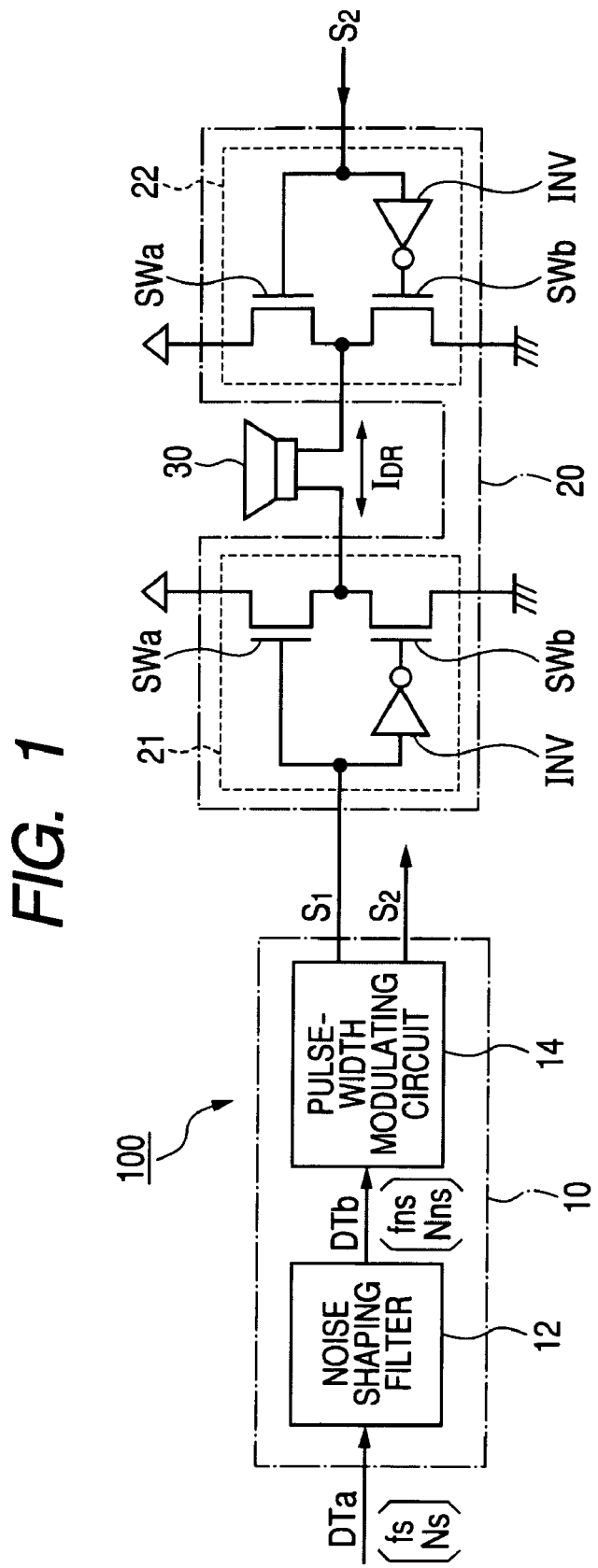
FIG. 1 is a block diagram for showing an arrangement of a class-D amplifying apparatus according to an embodiment of the present invention.

FIG. 1 is a block diagram for showing an arrangement of a class-D amplifying apparatus 100 according to an embodiment of the present invention. As indicated in FIG. 1, the class-D amplifying apparatus 100 is equipped with a signal generating apparatus 10 and a driving apparatus 20. A data series "D Ta" is supplied from an upstream apparatus to the signal generating apparatus 10. The data series "D Ta" corresponds to a time sequence of Ns-bit data generated at a sampling frequency "fs". The signal generating apparatus 10 generates pulse-width modulation signals "S1" and "S2" of two systems from the data series "D Ta". It should be understood that when descriptions as to elements related to the pulse-width modulation signal "S1", and also, elements related to the pulse-width modulation signal "S2" are commonly used in the below-mentioned descriptions, suffixes "i" (i=1, 2) will be applied to symbols of these relevant elements in order to omit individual explanations thereof.

The driving apparatus 20 corresponds to a full-bridge type driving circuit which drives a load circuit 30 in a BTL (Bridge Tied Load) system based upon the pulse-width modulation signals "S1" and "S2". In FIG. 1, such a case that a speaker apparatus is employed as the drive circuit 30 has been exemplified. The driving apparatus 20 is equipped with a driving unit 21 and another driving unit 22. Each of the driving units 21 and 22 is arranged by switching elements "SWa" and "SWb", and an inverter circuit "INV". The switching elements "SWa" and "SWb" are N-channel type field-effect transistors which have been series-connected between power supply lines. An output terminal of the inverter circuit INV is connected to a gate of the switching element SWb. The pulse-width modulation signal S1 is supplied to both a gate of the switching element SWa of the driving unit 21, and an input terminal of the inverter circuit INV of the driving circuit 21. The pulse width modulation signal S2 is supplied to a gate of the switching element SWa of the driving unit 22, and an input terminal of the inverter circuit INV of the driving unit 22.

In the above-described arrangement, when a signal level of the pulse-width modulation signal "S1" is set to a high level and a signal level of the pulse-width modulation signal "S2" is set to a low level, a drive current "I DR" flows through a signal path defined from the switching element "SWa" of the driving unit 21 via the load circuit 30 to the switching element "SWb" of the driving circuit 22. On the other hand, when a signal level of the pulse-width modulation signal "S1" is set to a low level and a signal level of the pulse-width modulation signal "S2" is set to a high level, the drive current "I DR" flows through a signal path defined from the switching element "SWa" of the driving unit 22 via the load circuit 30 to the switching element "SWb" of the driving circuit 21.

As shown in FIG. 1, the signal generating apparatus 10 is equipped with a noise shaping filter 12 and a pulse-width modulating circuit 14. The noise shaping filter 12 generates a data series "D Tb" from the data series "D Ta" while the noise shaping filter 12 suppresses (namely, noise shaping) a quantize noise in an audio range. The above-described data series "D Tb" is a time sequence of such a data "X" whose bit number is smaller than the bit number "Ns" of each of the data contained in the data sequence "D Ta". A sampling frequency "fns" of the data series "D Tb" exceeds the sampling frequency "fs" of the data series "D Ta".

Figure 2:
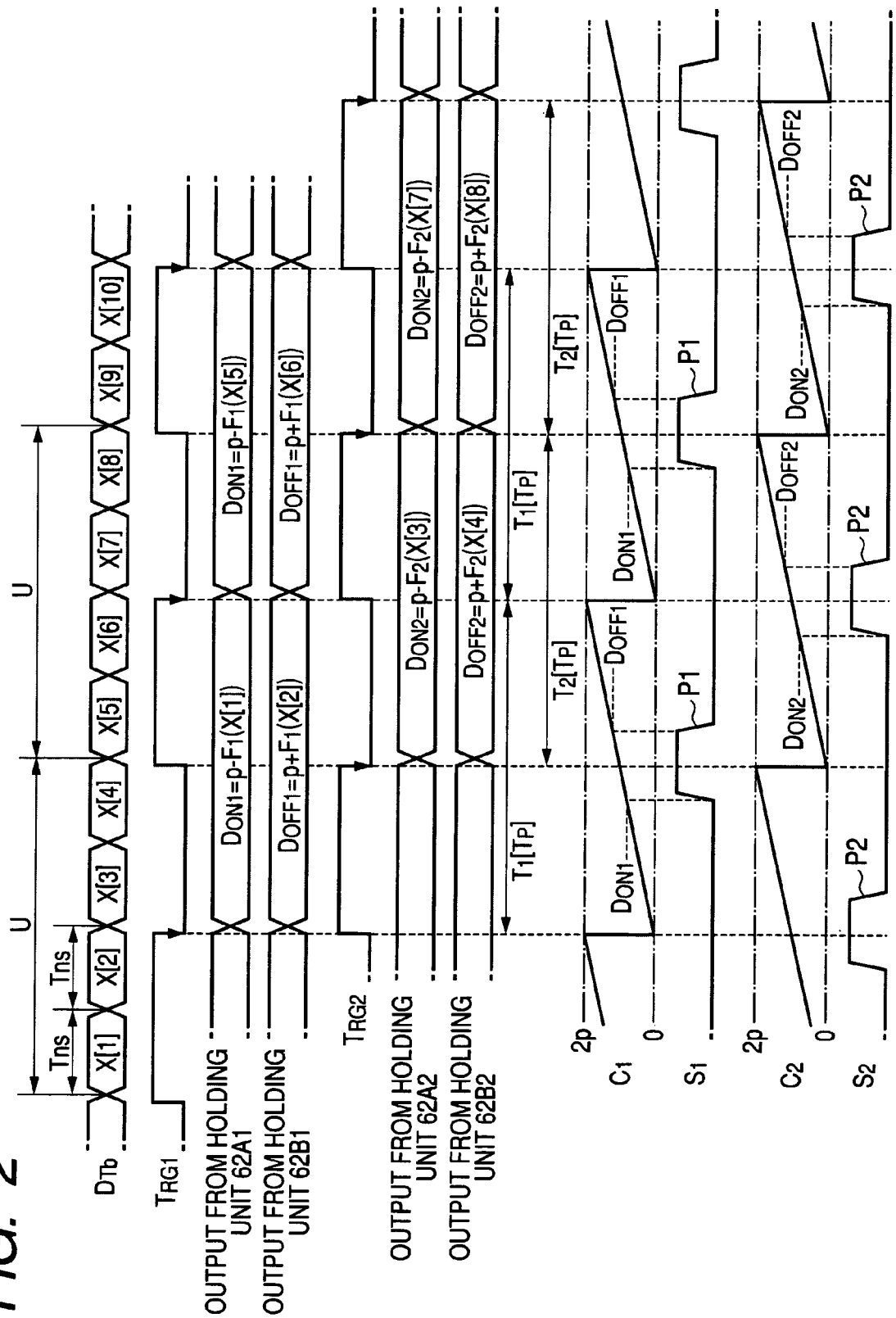
FIG. 2 is a timing chart for describing operations of a pulse-width modulating circuit employed in the class-D amplifying apparatus of FIG. 1.

The pulse-width modulating circuit 14 modulates each data "X" of the data series "D Tb" in the pulse-width modulation manner so as to generate the pulse-width modulation signals "S1" and "S2". FIG. 2 is a timing chart for explaining operations of the pulse-width modulating circuit 14. As represented in FIG. 2, the pulse-width modulation signal "S1" is such a signal that a pulse "P1" has been arranged every unit period "T1". On the other hand, the pulse-width modulation signal "S2" is such a signal that a pulse "P2" has been arranged every unit period "T2". Both the unit periods "T1" and "T2" are set to a commonly-used time length (pulse period) "Tp". A phase difference between the pulse-width modulation signal S1 and the pulse-width modulation signal S2 is 180 degrees. As a consequence, the respective pulses "P2" of the pulse-width modulation signal S2 are positioned between the adjacent pulses "P1" which are located before and after one pulse "P2" within the pulse-width modulation signal S1.

Figure 3:
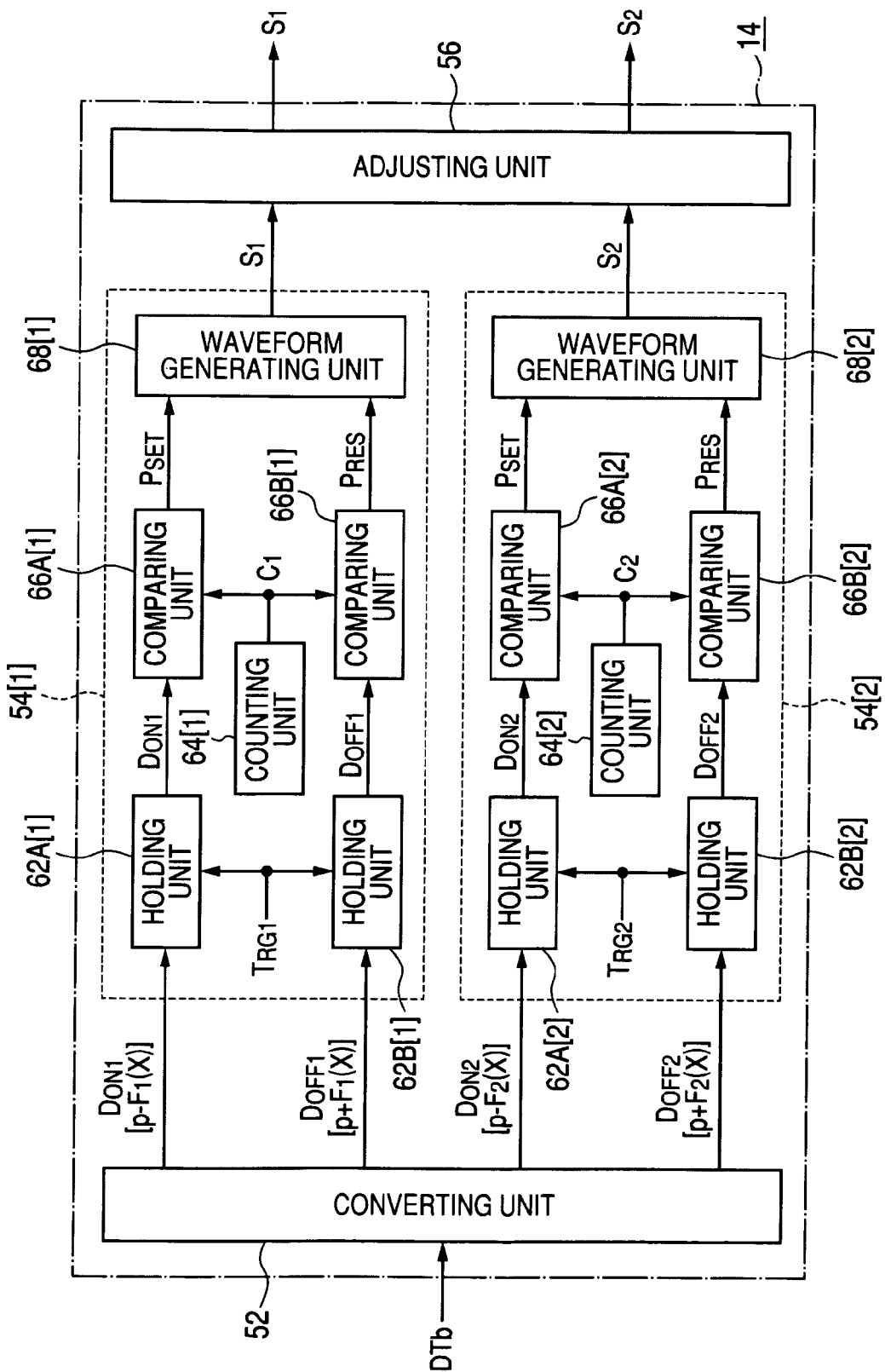
FIG. 3 is a block diagram for showing an arrangement of the pulse-width modulating circuit employed in the class-D amplifying apparatus of FIG. 1.

FIG. 3 is a block diagram for exemplifying a concrete arrangement of the above-described pulse-width modulating circuit 14. As shown in FIG. 3, the pulse-width modulating circuit 14 includes a converting unit 52, signal generating units "54[1]" and "54[2]", and an adjusting unit 56. As shown in FIG. 2, the respective data "X" (X[1], X[2], X[3], - - - ) of the data series "D Tb" are sequentially supplied from the noise shaping filter 12 every sampling period "Tns" corresponding to the sampling frequency "fns". The data series "D Tb" is sectioned while a set (will be referred to as "unit series" hereinafter) "U" of 4 pieces of continuous data "X" is defined as a unit, for the sake of convenience.

The signal generating unit 54[1] of FIG. 3 generates the pulse-width modulation signal S1, and the signal generating unit 54[2] thereof generates the pulse-width modulation signal S2. One pulse P1 of the pulse-width modulation signal S1, and one pulse P2 of the pulse-width modulation signal S2 are defined in response to 4 pieces of data "X" (for example, X[1] to X[4]) of one unit series "U". More precisely speaking, the signal generating unit 54[1] sets a time point of a front edge of the pulse P1 in response to first data "X" (X[1], X[5], - - - ) of the unit series "U", and also the signal generating unit 54 [1.] sets a time point of a rear edge of the pulse P1 in response to second data "X" (X[2], X[6], - - - ) of the unit series "U". Further, the signal generating unit 54[2] sets a time point of a front edge of the pulse P2 in response to third data "X" (X[3], X[7], - - - ) of the unit series "U", and also, the signal generating unit 54[2] sets a time point of a rear edge of the pulse P2 in response to fourth data "X" (X[4], X[8], - - - ) of the unit series "U".

The converting unit 52 of FIG. 3 generates pulse definition data ("D ON1", "D OFF1", "D ON2", "D OFF2") which define both the pulses "P1" and "P2" based upon 4 pieces of the data "X" within the unit series "U". A pulse definition data "D ONi" corresponds to data which defines a time point of a front edge (namely, rising edge) of a pulse "Pi", and a pulse definition data "D OFFi" corresponds to data which defines a time point of a rear edge (namely, falling edge) of the pulse "Pi".

Figure 4:
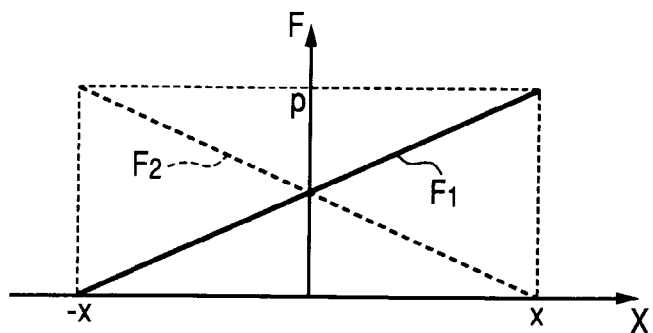
FIG. 4 is a graph for representing contents of conversion functions which are used by a converting unit employed in the class-D amplifying apparatus of FIG. 1.

In order to generate the pulse definition data ("D NO1", "D OFF1", "D ON2", "D OFF2"), 2 sorts of conversion functions "F1" and "F2" are used. FIG. 4 is a graph for exemplifying contents of the conversion functions "F1" and "F2". As indicated in FIG. 4, the conversion function "F1" is defined as follows: That is, when the numeral value of the data "X" is a minimum value (-x), the function value "F1(X)" becomes zero, and the function value "F1(X)" is linearly increased in connection with an increase of the numeral value of the data "X"; and when the numeral value of the data "X" is a maximum value "(x)", the function value "F1(X)" becomes a predetermined value "p". On the other hand, the conversion function "F2" is defined as follows: That is, when the numeral value of the data "X" is the minimum value (-x), the function value "F2(X)" becomes the predetermined value "p", and the function value "F2(X)" is linearly decreased in connection with the increase of the numeral value of the data "X"; and when the numeral value of the data "X" is the maximum value "(x)", the function value "F2(X)" becomes zero.

The converting unit 52 of FIG. 3 sets such a numeral value (P-F1(X[1]) to the pulse definition data "D ON1", which is obtained by subtracting a function value "F1(X[1])" where the first data "X[1]" of the unit series "U" has been substituted for the conversion function "F1" from a predetermined value "p", and also, the converting unit 52 sets such an added value (p+F1(X[2])) to the pulse definition data "D OFF1", which is obtained by adding another function value "F1(X[2])" where the second data "X[2]" of the unit series "U" has been substituted for the conversion function "F1" to the predetermined value "p". Further, the converting unit 52 sets such a numeral value (p-F2(X[3])) to the pulse definition data "DON2", which is obtained by subtracting a function value "F2 (X[3])" where the third data "X[3]" of the unit series "U" has been substituted for the conversion function "F2" from the predetermined value "p", and also, the converting unit 52 sets such an added value (p+F2 (X[4])) to the pulse definition data "DOFF2", which is obtained by adding another function value "F2(X[4])" where the fourth data "X[4]" of the unit series "U" has been substituted for the conversion function "F2" to the predetermined value "p". It should also be noted that although the unit series "U" of the data X[1] to X[4] have been exemplified in the above description, the pulse definition data (D ON1", "D OFF1" "D ON2", "D OFF2") may be sequentially generated in accordance with a similar rule with respect to other unit series "U" (for example, unit series "U" which are constituted by data X[5] to X[8]).

The signal generating unit 54 [i] is constituted by holding units 62A[i] and 62B[i], a counting unit 64[i], comparing units 66A[i] and 66B[i], and a waveform generating unit 68[i]. Signals "TRGi" are supplied to the holding units 62A[i] and 62B[i]. As indicated in FIG. 2, a signal TRG1 and another signal TRG2 correspond to such signals having time periods equal to the pulse period "TP", the phase difference of which is 180 degrees. In other words, the signal TRG1 falls at a starting point (endpoint) of each unit time period "T1", and the signal TRG2 falls at a starting point (end point) of each unit time period "T2". As shown in FIG. 2, the holding unit 62A[i] corresponds to a circuit (latch circuit) which holds and outputs the pulse definition data "D ONi" generated by the converting unit 52 at a falling time point of the signal "TRGi". Similarly, the holding unit 62B[i] corresponds to a circuit (latch circuit) which holds and outputs the pulse definition data "D OFFi" generated by the converting unit 52 at a falling time point of the signal "TRGi".

The counting unit 64[i] of FIG. 3 is a counter which generates a count value "Ci". As indicated in FIG. 2, the count value "Ci" is initialized to become zero at a starting point of a unit time period "Ti", is linearly increased in connection with a time elapse, and then, reaches a predetermined value "2p" at an end point of the unit time period "Ti". As a consequence, the count value "Ci" represents a waveform having a saw-tooth shape, the time period of which is equal to a pulse period "TP".

Figure 5:
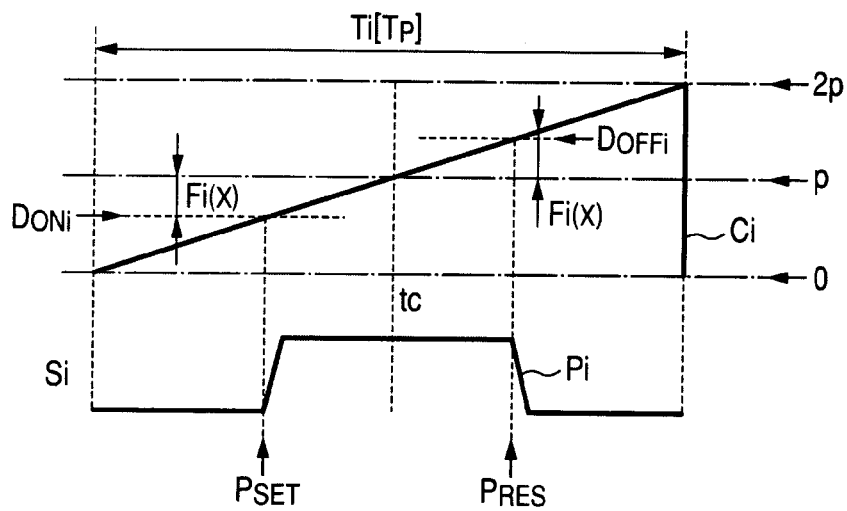
FIG. 5 is a timing chart for showing a relation between count values and pulses of the pulse-width modulating circuit of FIG. 3.

FIG. 5 is a timing chart for representing a relation between the count-value "Ci" and a pulse-width modulation signal "Si" within a single unit time period "Ti". A comparing unit 66A[i] compares pulse definition data "D ONi" which is outputted from a holding unit 62A[i] with the count value "Ci" which is outputted from the counting unit 64 [i], and as shown in FIG. 5, the comparing unit 66A[i] outputs a set signal "P SET" at a time point when the count value Ci exceeds the numeral value of the pulse definition data "D ONi". On the other hand, a comparing unit 66B[i] compares pulse definition data "D OFFi" which is outputted from a holding unit 62B[i] with the count value "Ci" which is outputted from the counting unit 64[i], and as shown in FIG. 5, the comparing unit 66B[i] outputs a reset signal "P RES" at a time point when the count value "Ci" exceeds the numeral value of the pulse definition data "D OFF".

The waveform generating unit 68 [i] of FIG. 3 changes the signal level of the pulse-width modulation signal "Si" from a low level to a high level (namely, forms a front edge of pulse "Pi") at the time point when the set signal "P SET" is outputted from the comparing unit 66A[i], and changes the signal level of the pulse-width modulation signal "Si" from the high level to the low level (namely, forms a rear edge of pulse "Pi") at the time point when the reset signal "P RET" is outputted from the comparing unit 66B[i]. As a consequence, as shown in FIG. 5, the pulse "Pi" has such a shape that a portion preceding from a time point (namely, center point) "tc", which divides the unit time period "Ti" by ½, by a time length in response to the pulse definition data "DONi" is defined as the front edge, whereas a portion in which a time length responding to the pulse definition data "D OFFi" has elapsed from the center point "tc" is defined as a rear edge.

The larger the numeral value of the data "X" becomes, the smaller the numeral value (p−F1(X)) of the pulse definition data "D ON1" becomes. As a result, the larger the numeral value of the data "X" becomes, the further the front edge of the pulse P1 is moved to the former time point. Also, the larger the numeral value of the data "X" becomes, the larger the numeral value (p+F1(X)) of the pulse definition data "D OFF1" becomes. As a result, the larger the numeral value of the data "X" is increased, the later the rear edge of the pulse P1 is moved to the later time point. In other words, the larger the numeral value of the first, or second data "X" of the unit series "U" becomes, the wider the pulse width of the pulse "P1" in the pulse-width modulation signal "S1" becomes. For instance, in such a case that the numeral values of the data X[1] and the data X[2] of the unit series "U" are maximum values (x), the function values F1(X[1]) and F1(X[2]) become the predetermined value "p" (refer to FIG. 4), the numeral value (p−F1(X[1])) of the pulse definition data "D ON1" is set to zero, and also, the numeral value (p+F1(X[2])) of the pulse definition data "D OFF2" is set to the predetermined value "2p". As a consequence, a duty ratio of the pulse-width modulation signal "S1" within the unit time period "T1" becomes 100%.

On the other hand, the lager the numeral value of the data "X" becomes, the larger the numeral value (p−F2(X)) of the pulse definition data "D ON2" becomes. As a result, the larger the numeral value of the data "X" becomes, the further the front edge of the pulse "P2" is moved to the delayed time point. Also, the larger the numeral value of the data "X" becomes, the smaller the numeral value (p+F2(X)) of the pulse definition data "D OFF2" becomes. As a result, the larger the numeral value of the data "X" becomes, the further the rear edge of the pulse "P2" is moved to the former time point. In other words, the larger the numeral value of the third, or fourth data "X" of the unit series "U" becomes, the narrower the pulse width of the pulse "P2" in the pulse-width modulation signal "S2" becomes. For instance, in such a case that the numeral values of the data X[3] and the data X[4] of the unit series "U" are maximum values (x), the function values F2(X[3]) and F2(X[4]) become zero (refer to FIG. 4), so that any of the numeral value (p−F1(X[3])) of the pulse definition data "D ON2" and also, the numeral value (p+F2(X[4])) of the pulse definition data "D OFF2" is set to the predetermined value "p". As a consequence, a duty ratio of the pulse-width modulation signal "S2" within the unit time period "T2" becomes 0%.

Although it is possible to state that the large/small relationship between the numeral values of the data "X", and the short/long relationship between the pulse widths with respect to the pulse "P1" and "P2" have the opposite sense, for example, in such a case that the numeral value of the data "X" within the unit series "U" is largely changed, there are some possibilities that the signal levels of both the pulses "P1" and "P2" are transferred to high levels (in other words, pulse "P1" is overlapped with pulse "P2"). For instance, in such a case that the data "X[2]" of the unit series "U" has a sufficiently large numeral value and the data "X[3]" thereof has a sufficiently small numeral value, both the pulse widths of the pulses "P1" and "P2" are increased, and then, the increased pulse widths are overlapped with each other. The adjusting unit 56 of FIG. 3 is provided to avoid the above-explained overlapping phenomenon of the pulses P1 and P2. In other words, when the pulse "P1" is overlapped with the pulse "P2", the adjusting unit 56 changes logic levels of the pulse-width modulation signals "S1" and "S2". For example, the adjusting unit 56 maintains one of the pulses "P1" and "P2" in a high level, and further, changes the signal level of the other pulse into a low level in a forcible manner. With employment of the above-described arrangement, it is possible to eliminate such a possibility that both the switching element "SWa" of the driving unit 21 and the switching element "SWa" of the driving unit 22 are conducted at the same time. As a result, the load circuit 30 can be properly driven in response to the respective data "X" of the data series "D Tb".

As previously described, the pulse-width modulation signal "S1" becomes such a signal that the pulse "P1" where two pieces of the front half data "X" within the unit series "U" have been modulated in the pulse-width modulating manner are arranged every unit time period "T1". Further, the pulse-width modulation signal "S2" becomes such a signal that the pulse "P2" where two pieces of the rear half data "X" within the unit series "U" have been modulated in the pulse-width modulation manner are arranged every unit time period "T2". As a consequence, the resolution (namely, stepping width of current amount of drive current "I DR") as to the pulse-width modulation signals "S1" and "S2" can be improved, as compared with that of a circuit arrangement in which a pulse width of a single pulse of a pulse-width modulation signal is controlled by one piece of data.

Figure 6:
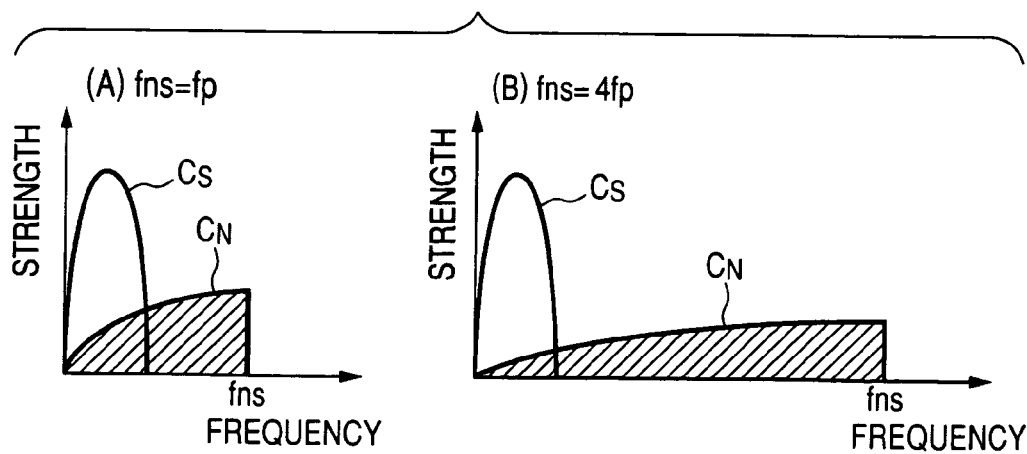
FIG. 6 is a conceptional drawing for describing effects achieved by the present embodiment.

Further, as previously described, 4 pieces of the data "X" within the unit series "U" are modulated in the pulse-width modulation manner within the pulse period "TP". As a result, as shown in FIG. 2, the pulse period "TP" is set to such a time length equal to 4 time periods of the sampling period "Tns". In other words, the sampling frequency "fns" can be set to be 4 times higher than such a frequency (will be referred to as "carrier frequency" hereinafter) "fp" which corresponds to the pulse period "TP" of the pulse-width modulation signal "S1", or "S2". Both a part (A) and another part (B) of FIG. 6 are conceptional diagrams for indicating a relation between a quantize noise "CN" and a signal component "CS", which are represented by the data series "D Tb" outputted from the noise shaping filter 12. The part (A) of FIG. 6 supposes such a conventional structure that the sampling frequency "fns" has been set to the same frequency as the carrier frequency "fp", whereas the part (B) of FIG. 6 supposes such a structure of the present embodiment that the sampling frequency "fn" has been set to be 4 times higher than the carrier frequency "fp". As shown in FIG. 6, in the present embodiment, since the sampling frequency "fns" is increased, a range where the quantize noise "CN" is distributed is enlarged, and on the other hand, a strength of the quantize noise "CN" is reduced by approximately ¼, as compared with the case shown in the part (A) of FIG. 6. The above-described strength of the quantize noise "CN" implies, especially, such a strength of the quantize noise "CN" which is superimposed with a range where the signal component "CS" is distributed. As a consequence, it is possible that a dynamic range of a current amount of the drive current "I DR" can be sufficiently secured (S/N ratio of drive current "I DR" can be improved).

It should also be noted that the above-described respective embodiments may be modified in a various manner. Concrete modifications will be exemplified in the below-mentioned descriptions. Alternatively, the below-mentioned modifications may be combined with each other.

(1) Modification 1

Figure 7:
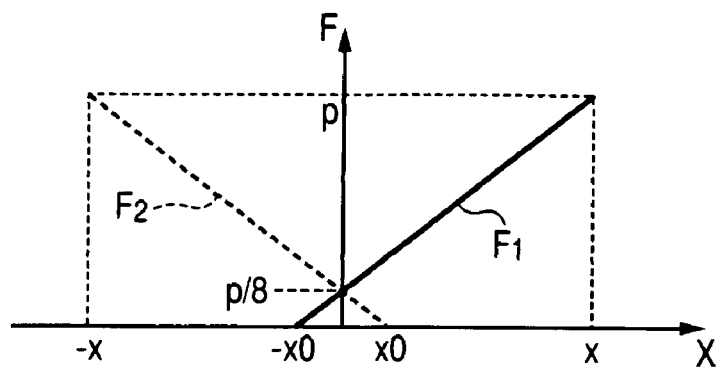
FIG. 7 is a graph for representing contents of conversion functions according to a modification 1 of the present invention.
Figure 8:
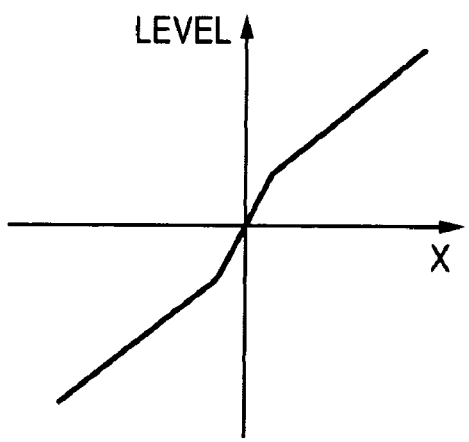
FIG. 8 is a graph for showing a relation between data and current amounts of drive currents according to the modification 1.
Figure 9:
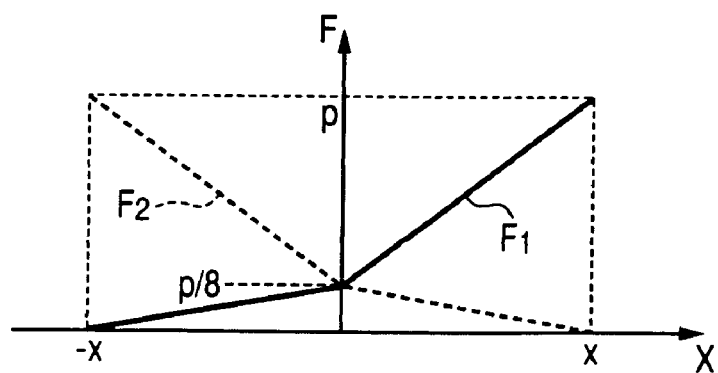
FIG. 9 is a graph for representing contents of conversion functions according to a modification 1 of the present invention.

The relationship between the numeral values of the respective data "X" of the data series "ID Tb1", and the function values F1(X) and F2(X) is not limited only to the exemplified relationship of FIG. 4. For example, as indicated in FIG. 7, the conversion functions "F1" and "F2" may be alternatively defined in such a manner that when the numeral value of the data "X" becomes smaller than a predetermined value (−x0), the function value "F1(X)" becomes zero, whereas when the numeral value of the data "X" exceeds the predetermined value (x0), the function value F2(X) becomes zero. In the embodiment of FIG. 7, when the numeral value of the data "X" becomes smaller than the predetermined value (−x0), the pulse width of the pulse P1 becomes zero, whereas when the numeral value of the data "X" exceeds the predetermined value (x0), the pulse width of the pulse P2 becomes zero. As a consequence, a current amount of a drive current "I DR" flowing through the load circuit 30 may be suppressed. It should also be understood that in the embodiment of FIG. 7, as exemplified in FIG. 8, a relationship between the numeral value of the data "X" and the current amount (level) of the drive current "I DR" does not constitute a straight line. As a consequence, since the conversion functions "F1" and "F2" are defined as represented in FIG. 9, such an arrangement that the current amount of the drive current "I DR" is linearly changed in response to the numeral value of the data "X" may also be suitably employed.

(2) Modification 2

Figure 10:
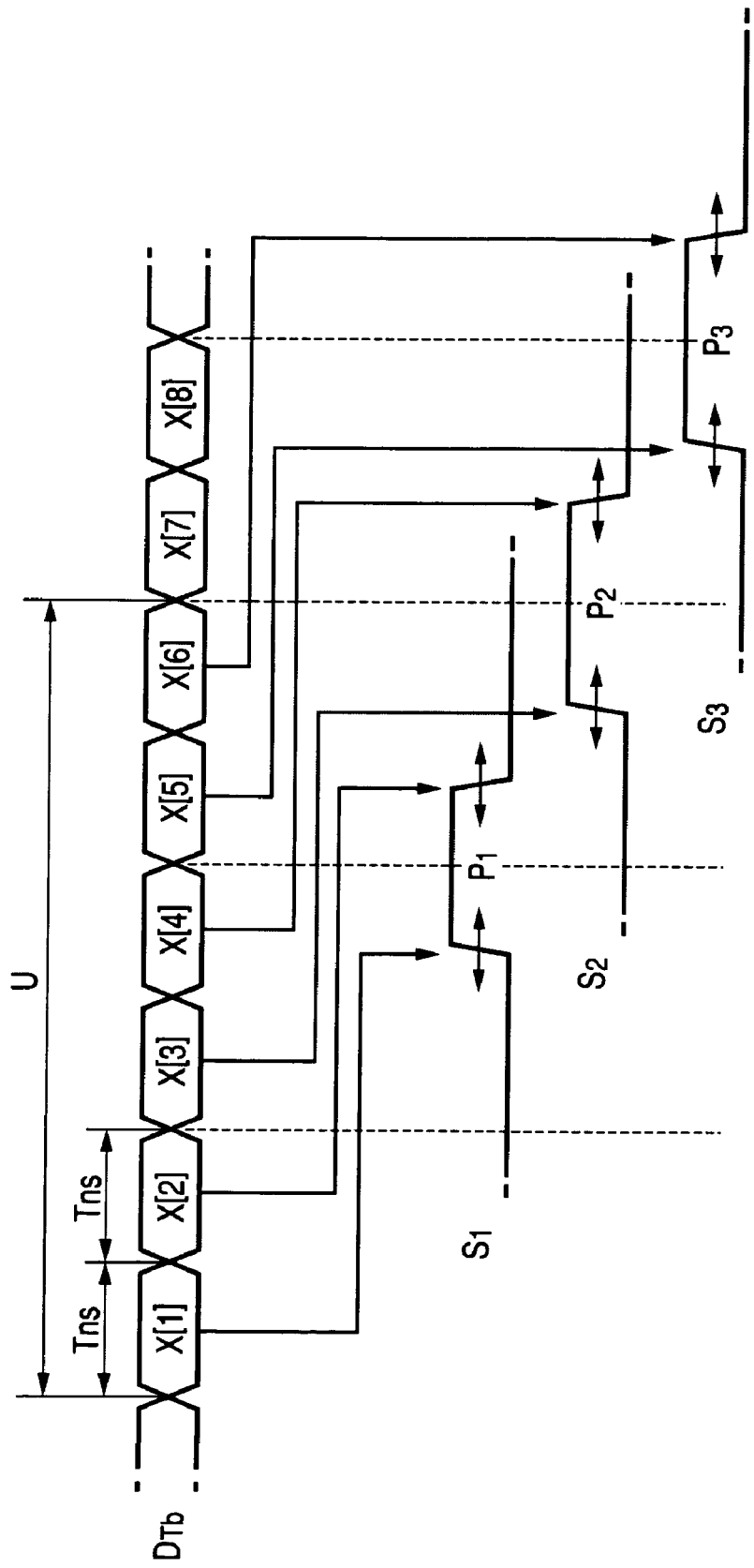
FIG. 10 is a timing chart for showing operations of a pulse-width modulating circuit according to the modification 2.

In the above-described embodiments, the signal generating apparatus 10 generates both the pulse-width modulation signals "S1" and "S2" of the two systems. Alternatively, a total number of pulse-width modulation signals "S" may be properly changed. FIG. 10 is a timing chart for explaining operations for generating pulse-width modulation signals "S1" to "S3" of 3 systems by the signal generating apparatus 10. A unit series "U" obtained by segmenting the data series "DTb" contains 6 pieces of data "X" (X[1] to X[6]). The pule-width modulation signals "S1" and "S2" may be generated in response to the data X[1] to X[4] within the unit series "U" in a similar manner to the above-described embodiment. On the other hand, as to a pulse "P3" of the pulse-width modulation signal "S3", a time point of a front edge thereof is set in response to the fifth data X[5], and a time point of a rear edge thereof is set in response to the sixth data X[6] within the unit series "U". In accordance with the above-described arrangement, the sampling period "Tns" may be furthermore shortened with respect to the pulse period "TP".

What is claimed is:

1. A signal generating apparatus comprising:
    a data generator which generates a data series in which a plurality of data containing first data, second data, third data, and fourth data are arranged at a predetermined sampling period;
    a first signal generator which generates a first pulse-width modulation signal in which a pulse is arranged in a pulse period longer than the predetermined sampling period, a time point of a front edge of the pulse being set in response to the first data, and a time point of a rear edge of the pulse being set in response to the second data; and
    a second signal generator which generates a second pulse-width modulation signal in which a pulse is arranged between the adjacent pulses of the first pulse-width modulation signal, a time point of a front edge of the pulse of the second pulse-width modulation signal been set in response to the third data, and a time point of a rear edge of the pulse of the second pulse-width modulation signal been set in response to the fourth data.

2. The signal generating apparatus according claim 1, wherein
    the first signal generator generates the first pulse-width modulation signal in such a manner that the larger the numeral value of the first data, or the second data becomes, the wider the pulse width thereof becomes; and
    the second signal generator generates the second pulse-width modulation signal in such a manner that the larger the numeral value of the third data, or the fourth data become, the narrower the pulse width thereof becomes.

3. The signal generating apparatus according claim 1 further comprising:
    an adjusting unit which changes a logic level of the first pulse-width modulation signal and a logic level of the second pulse-width modulation signal to be different from each other in such a case that the pulse of the first pulse-width modulation signal is overlapped with the pulse of the second pulse-width modulation signal.

4. The signal generating apparatus according to claim 1 further comprising:
    a converting unit which converts the first data into a first pulse definition data, converts the second data into a second pulse definition data, converts the third data into a third pulse definition data and convert the fourth data into a fourth pulse definition data;
    wherein the first signal generator includes:
        a first holding unit which holds the first pulse definition data;
        a second holding unit which holds the second pulse definition data;
        a first counter which generates first count values representing a waveform having a saw-tooth shape;
        a first comparator which compares the first pulse definition data with the first count values;
        a second comparator which compares the second pulse definition data with the first count values; and
        a first waveform generating unit which generates the first pulse-width modulation signal based on the comparison results of the first and second comparators, and
    wherein the second signal generator includes:
        a third holding unit which holds the third pulse definition data;
        a fourth holding unit which holds the fourth pulse definition data;
        a second counter which generates second count values representing a waveform having a saw-tooth shape;
        a third comparator which compares the third pulse definition data with the second count values;
        a fourth comparator which compares the fourth pulse definition data with the second count values; and
        a second waveform generating unit which generates the second pulse-width modulation signal based on the comparison results of the third and fourth comparators.

5. A class-D amplifying apparatus comprising:
    a data generator which generates a data series in which a plurality of data containing first data, second data, third data, and fourth data are arranged at a predetermined sampling period;
    a first signal generator which generates a first pulse-width modulation signal in which a pulse is arranged in a pulse period longer than the predetermined sampling period, a time point of a front edge of the pulse being set in response to the first data, and a time point of a rear edge of the pulse being set in response to the second data;
    a second signal generator which generates a second pulse-width modulation signal in which a pulse is arranged between the adjacent pulses of the first pulse-width modulation signal, a time point of a front edge of the pulse of the second pulse-width modulation signal been set in response to the third data, and a time point of a rear edge of the pulse of the second pulse-width modulation signal been set in response to the fourth data;
    a first driver for controlling a supply of electric power with respect to a load circuit in response to the first pulse-width modulation signal; and
    a second driver for controlling the supply of the electric power with respect to the load circuit in response to the second pulse-width modulation signal.

* * * * *